United States Patent [19]
Semba

[11] Patent Number: 6,133,981
[45] Date of Patent: Oct. 17, 2000

[54] PROCESSING SYSTEM

[75] Inventor: Norio Semba, Kumamoto-ken, Japan

[73] Assignee: Tokyo Electron Ltd., Japan

[21] Appl. No.: 09/090,969

[22] Filed: Jun. 5, 1998

[30] Foreign Application Priority Data

Jun. 11, 1997 [JP] Japan ..................................... 9-169551

[51] Int. Cl.$^7$ .......................... G03B 27/32; G03B 27/52; G03D 5/00
[52] U.S. Cl. ................................. 355/27; 355/30; 396/611
[58] Field of Search ................................. 355/27, 30, 53, 355/72, 75; 118/719, 720, 722, 668; 414/187, 217, 222; 427/271; 396/611

[56] References Cited

U.S. PATENT DOCUMENTS

| | | | |
|---|---|---|---|
| 5,240,556 | 8/1993 | Ishikawa et al. | 156/643 |
| 5,565,034 | 10/1996 | Nanbu et al. | 118/668 |
| 5,651,823 | 7/1997 | Parodi et al. | 118/500 |
| 5,686,143 | 11/1997 | Matsukawa et al. | 427/271 |
| 5,725,664 | 3/1998 | Nanbu et al. | 118/52 |
| 5,766,824 | 6/1998 | Batchelder et al. | 430/330 |
| 5,871,587 | 2/1999 | Hasegawa et al. | 118/719 |
| 5,876,280 | 3/1999 | Kitano et al. | 454/187 |

FOREIGN PATENT DOCUMENTS

| | | |
|---|---|---|
| 07142550 | 6/1995 | Japan. |
| 8-51067 | 2/1996 | Japan. |
| 9-45613 | 2/1997 | Japan. |
| 10-150089 | 6/1998 | Japan. |

*Primary Examiner*—Alan A. Mathews
*Assistant Examiner*—Hung Henry Nguyen
*Attorney, Agent, or Firm*—Rader, Fishman & Grauer

[57] ABSTRACT

A processing system includes a coating/developing station for performing either a solution processing for processing a substrate using solution or a thermal processing for thermally processing the substrate, and a transfer unit for transferring the substrate into and from the coating/developing station. A casing encases the coating/developing station and the transfer unit. An interface section, provided in the casing, transfers the substrate into and from an external exposure machine for exposing the resist on the substrate. A pressure setting device sets a pressure in the casing to be lower than a pressure in the external exposure machine.

17 Claims, 6 Drawing Sheets

PROCESSING SYSTEM

BACKGROUND OF THE INVENTION

The present invention relates to a processing system for processing a substrate using a solution and thermally processing it.

In a photoresist processing step of a semiconductor manufacturing process, resist solution is first coated on a surface of a substrate, such as a semiconductor wafer (hereinafter referred to as a wafer), thereby forming a resist film, the wafer is exposed with a predetermined pattern and thereafter subjected to development processing by use of a developer solution. Conventionally, a coating/developing system has been used to perform the aforementioned series of processes.

In general, the coating/developing system has a plurality of processing units. The processing units include, for example, an adhesion processing unit for improving the adhesion of resist to the wafer, a coating unit for coating the wafer with the resist solution, a thermal processing unit for subjecting the wafer coated with the resist solution to an atmosphere of a predetermined temperature to harden the resist, a thermal processing unit for subjecting the exposed wafer to an atmosphere of a predetermined temperature, and a developer unit for developing the exposed wafer with a developer solution. The wafer is transferred between these units by a transfer unit, such as a transfer arm. The wafer, on which a resist film has been formed in the coating unit and the thermal processing unit, is processed by an exposure processing unit, such as a step type projection exposure machine (hereinafter referred to as a stepper), so that it can be exposed with a predetermined pattern.

The aforementioned processing, e.g., the coating, developing and exposure processing, must be performed in a clean atmosphere. Therefore, it is necessary to avoid contamination of the wafer as far as possible. For this purpose, the coating/developing system and the exposure machine (e.g., the stepper) are encased by suitable casing members. Further, downflow of clean air is formed in the casings. The coating/developing system and the exposure machine (e.g., the stepper) are connected airtightly to each other. With this structure, the wafer can be transferred between the coating/developing system and the exposure machine in a clean atmosphere.

The coating/developing system, as described above, includes a coating unit for coating the wafer with the resist solution and a thermal processing unit for adjusting the temperature. There is a possibility that these units generate steam of an organic solvent, a high-temperature atmosphere, particles, etc. In addition, the internal pressures of the coating/developing system and the exposure machine are independent of each other, and not adjusted relative to each other.

When the coating/developing system is connected to the exposure machine, if the internal pressure of the coating/developing system is higher than that of the exposure machine, air flows from the coating/developing system to the exposure machine. Due to the airflow, the stream of an organic solvent, a high-temperature atmosphere and particles generated in the coating/developing system may flow into the exposure machine. Since the exposure machine (e.g., a stepper) requires very accurate alignment and an atmosphere of high cleanliness, an atmosphere from the outside of the exposure machine, in particular, a high-temperature atmosphere, stream of an organic solvent and particles, must be prevented from flowing into the exposure machine.

BRIEF SUMMARY OF THE INVENTION

An object of the present invention is to provide a processing system in which an atmosphere is prevented from flowing from a first processing unit into a second processing unit, so that an atmosphere is kept clean and a wafer can be subjected appropriately to a predetermined process in the second processing unit.

According to the present invention, there is provided a processing system comprising a first processing unit for performing a solution processing for processing a substrate using solution and a thermal processing for thermally processing the substrate, a transfer unit for transferring the substrate into and from the first processing unit, a casing for encasing the first processing unit and the transfer unit, an interface section, provided in the casing, for transferring the substrate into and from a second processing unit for subjecting a processing different from the solution processing and the thermal processing, and pressure setting means for setting a pressure in the casing lower than a pressure in the second processing unit.

The casing and the second processing machine are connected to each other via a tunnel section.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
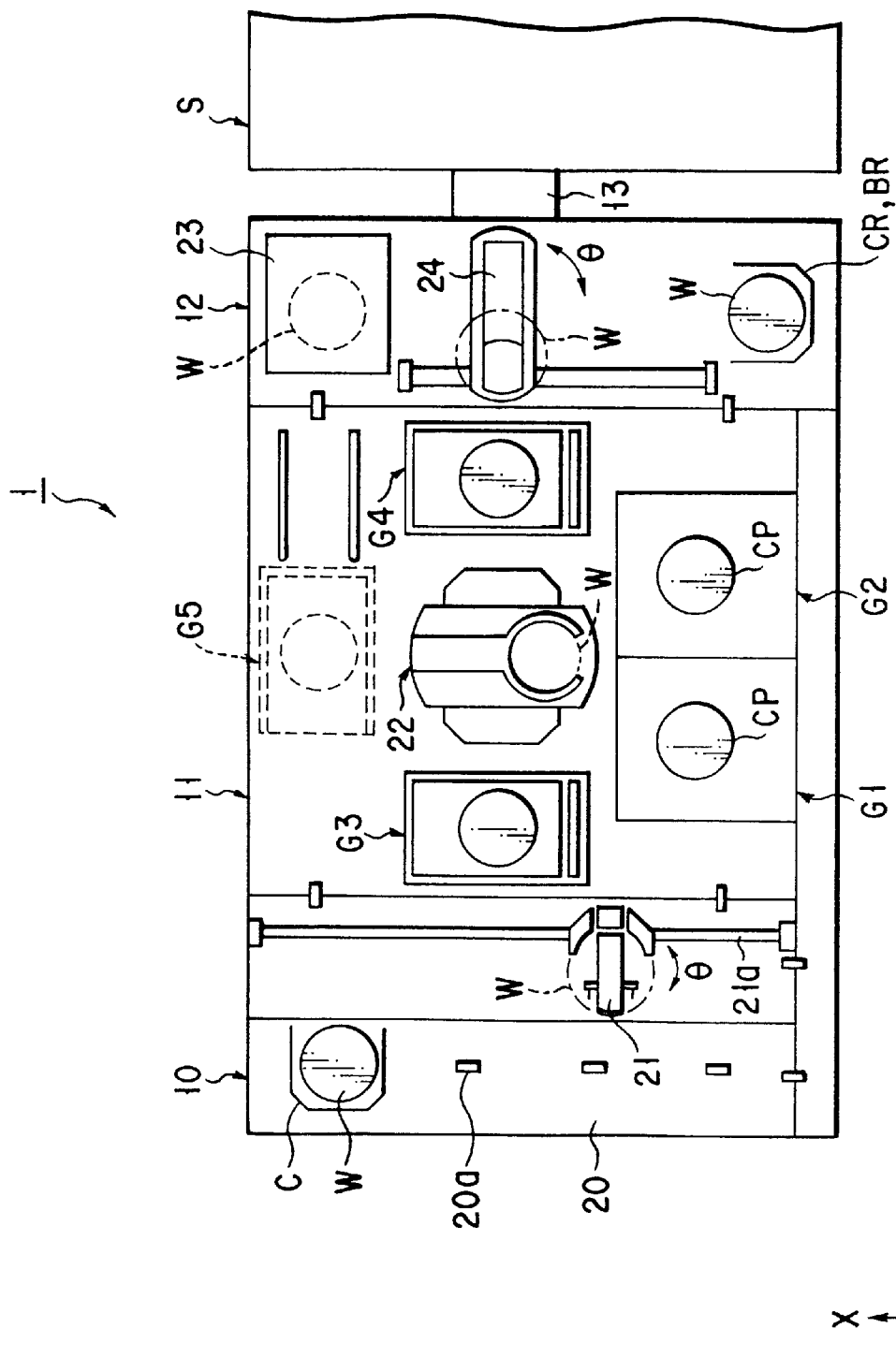
FIG. 1 is a plan view showing a coating/developing system and an exposure machine according to an embodiment of the present invention.

A preferred embodiment of the present invention will be described with reference to FIGS. 1 to 3.

A coating/developing system 1 comprises a cassette station 10 for transferring a cassette C which holds wafers in units of, for example, 25, from the outside into the system or from the system to the outside, and for transferring wafers W to or from the cassette C. It also comprises a process station 11 in which single-wafer processing units for processing wafers one by one are arranged at predetermined positions in a plurality of stages. Further, it comprises an interface section 12 for transferring wafers W between the process station 11 and another machine, e.g., an exposure machine S adjacent to the process station 11, via a tunnel section 13. The cassette station 10, the process station 11 and the interface section 12 are connected integrally as one unit.

In the cassette station 10, as shown in FIG. 1, for example, at most four cassettes C, each having a wafer inlet/outlet opening, are mounted on positioning projections 20a on a cassette table 20. The cassettes are arranged in an X direction, such that the wafer inlet/outlet openings are directed to the process station 11.

A wafer transfer mechanism 21 is movable along the direction in which the cassettes are arranged (the X direction) and the direction in which the wafers are accumulated in each cassette C (a Z direction: vertical direction). The wafer transfer mechanism 21 is movable along a transfer path 21a, so that it can access any cassette C.

The wafer transfer mechanism 21 is rotatable in a θ direction. As will be described later, it can access an alignment unit (ALIM) and an extension unit (EXT) of a multi-stage unit of a third processing unit group G3 in the process station 11.

The process station 11 has a main wafer transferring unit 22 of vertical transfer type in its central portion, as shown in FIG. 1. Around the main wafer transferring unit 22, various processing units are arranged in units, thus forming processing unit groups. In the coating/developing system 1 of this embodiment, five processing unit groups G1 to G5 can be disposed. The first and second processing unit group G1 and G2 are arranged in a front side portion of the system. The third processing unit group G3 is arranged in the vicinity of the cassette station 10. The fourth processing unit group G4 is arranged in the vicinity of the interface section 12. The fifth processing unit group G5, indicated by a broken line in FIG. 1, can be arranged in a rear side portion of the system.

Figure 2:
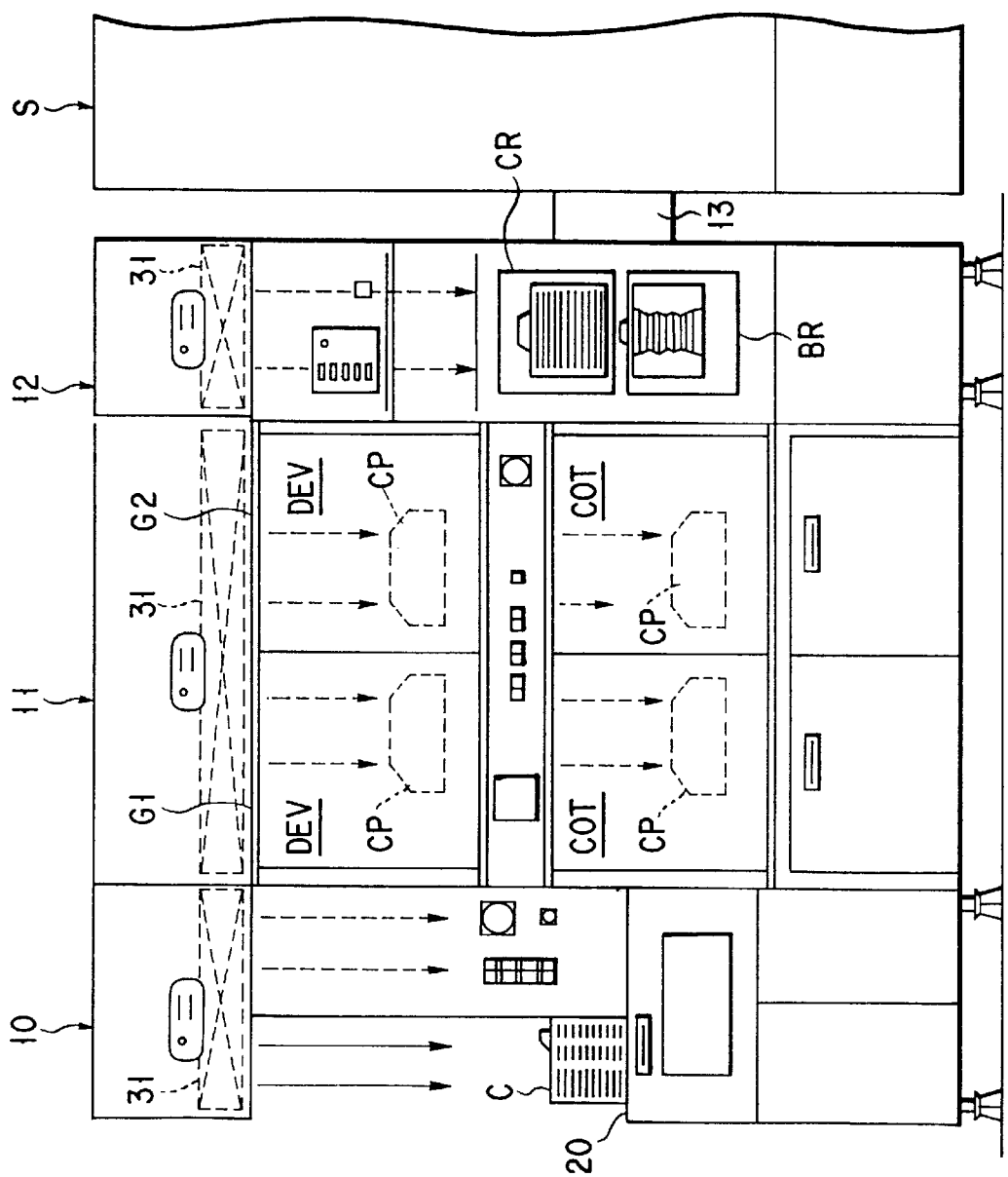
FIG. 2 is a front view of the coating/developing system and the exposure machine shown in FIG. 1.

As shown in FIG. 2, the first processing unit group G1 includes two spinner type process units, in which a wafer W is placed on a spin chuck in a cup CP and subjected to a predetermined process. For example, a resist coating unit (COT) and a developer unit (DEV) mounted thereon form two stages in the vertical direction. Similarly, the second processing unit group G2 includes two spinner type process units; for example, a resist coating unit (COT) and a developer unit (DEV) mounted thereon, forming two stages in the vertical direction.

Figure 3:
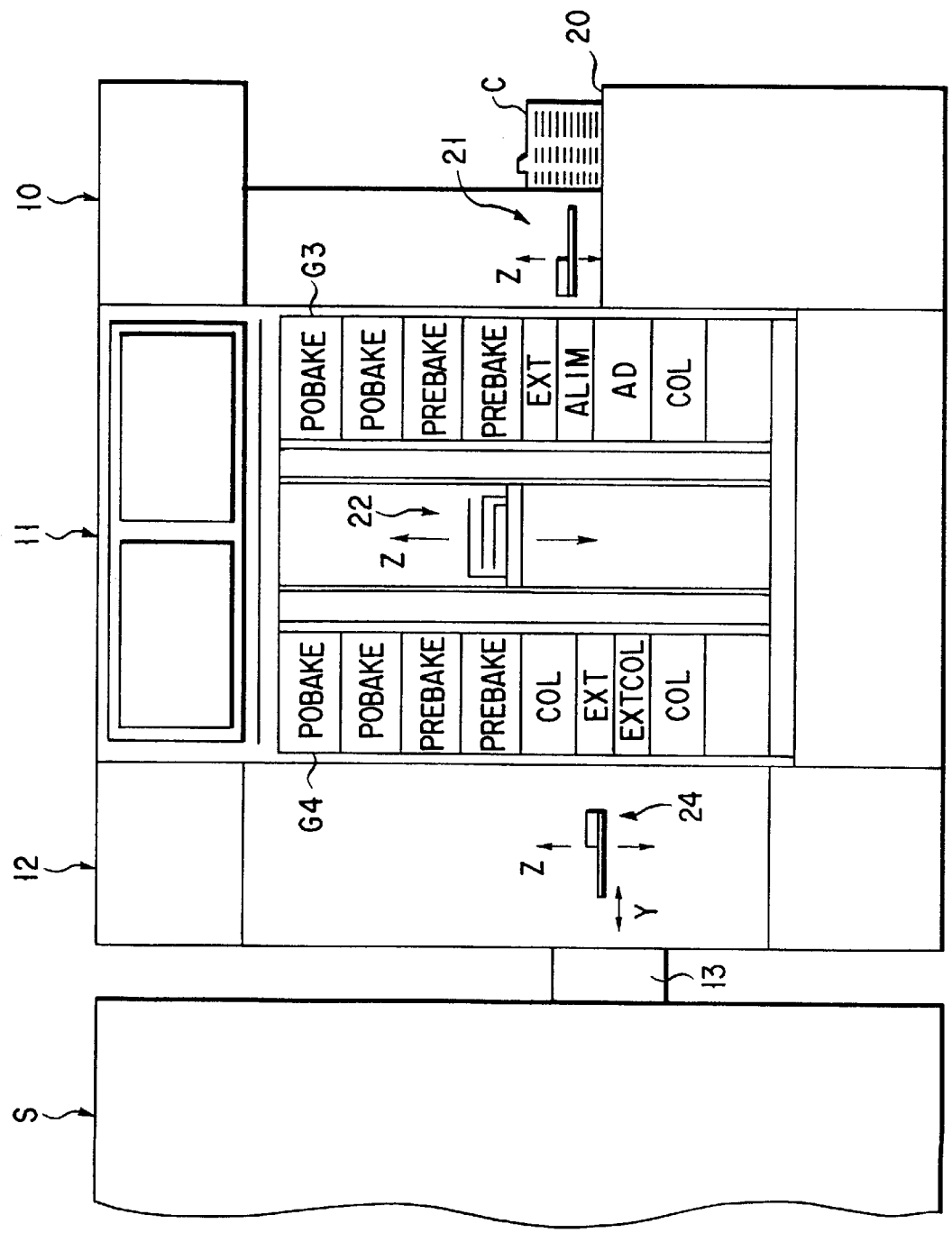
FIG. 3 is a rear view of the coating/developing system and the exposure machine shown in FIG. 1.

As shown in FIG. 3, the third processing unit group G3 includes an oven type process unit for processing a wafer placed on a table (not shown), for example, a cooling unit (COL) for cooling the wafers, an adhesion unit (AD) for performing adhesion processing to improve the adhesion of the resist, an alignment unit (ALIM) for aligning the wafers, an extension unit (EXT), pre-baking units (PREBAKE) for heating the wafers before exposure, and post-baking units (POBAKE) for heating the wafers after exposure. These units are accumulated in eight stages in this order from the bottom. The number of stages is not limited to eight.

The fourth processing unit group G4 also includes eight stages of process units accumulated in the following order from the bottom: for example, an oven type process unit, e.g., a cooling unit (COL), an extension and cooling unit (EXTCOL), an extension unit (EXT), a cooling unit (COL), pre-baking units (PREBAKE) and post-baking units (POBAKE).

As shown in FIGS. 1 and 2, a pickup cassette CR of a portable type and a buffer cassette BR of a fixed type are accumulated in two stages in a front portion of the interface section 12. An optical edge remover 23 is located in a rear portion of the interface section 12. A wafer transfer mechanism 24 is provided in a central portion of the interface section 12. The wafer transfer mechanism 24 is movable in X and Z (vertical) directions, so that it can access the cassettes CR and BR and the optical edge remover 23. The wafer transfer mechanism 24 is rotatable in the θ direction and movable in the Y direction, so that it can access not only the extension unit (EXT) included in the fourth processing unit group G4 of the process station 11 but also a wafer transfer table (not shown) of the exposure machine S through the tunnel section 13.

As shown in FIG. 2, in the coating/developing system 1, a high performance filter 31, for example, an ULPA filter (ultra particle filter), is provided in an uppermost portion of each of the three zones (the cassette station 10, the process station 11 and the interface section 12), in order to supply downflow of clean air from an upper portion to the cassette table 20, the transfer path 21a of the wafer transfer mechanism 21, the first to fifth processing unit groups G1 to G5 and the interface section 12. Air supplied to the high performance filter 31 from the upstream side is cleaned while passing through the filter 31. As a result, clean downflow as indicated by arrows of solid and broken lines shown in FIG. 2 is formed. Further, as shown in FIG. 4, suitable ducts are formed in the resist coating unit (COT) and the developer unit (DEV) which may generate organic components in the system, so that clean downflow can be supplied to these units.

Figure 4:
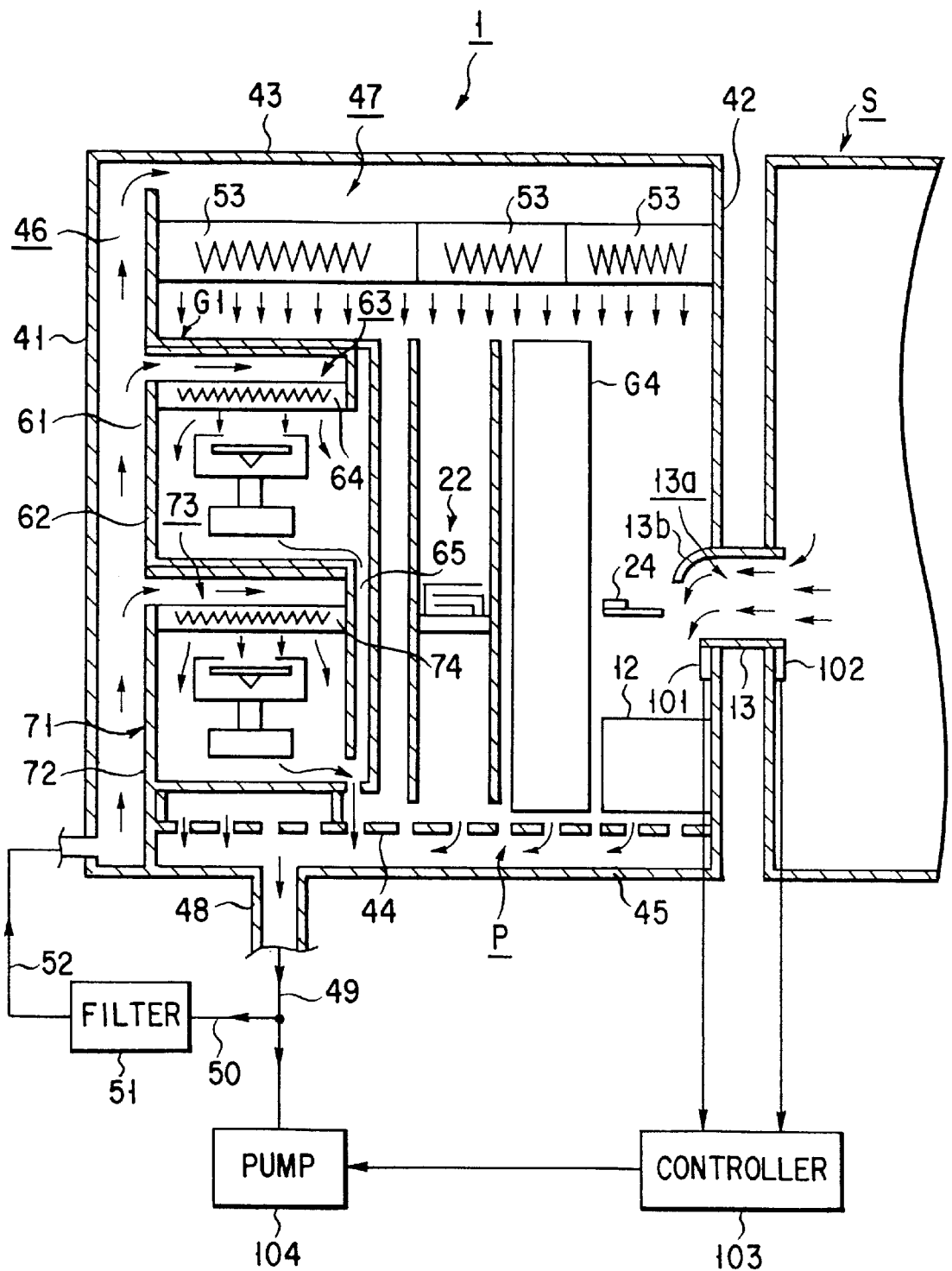
FIG. 4 is a cross-sectional view along a Y-axis schematically showing the interior of the coating/developing system and the exposure machine shown in FIG. 1.

As shown in FIG. 4, the coating/developing system 1 is surrounded by side plates 41 and 42, a top plate 43 and a bottom plate 45. A ventilating opening plate 44 is formed above the bottom plate 45 with a gap P. A wall duct 46 is formed on one side of the system, communicating with a ceiling chamber 47 formed under the top plate 43.

An exhaust hole 48 is formed in the bottom plate 45. A downstream atmosphere in the system collected through the ventilating opening plate 44 is exhausted to the outside through an exhaust pipe 49 connected to the exhaust hole 48. Part of the downstream atmosphere is introduced to a filter unit 51 having a gas-liquid contact space (not shown). The exhaust pipe 49 may be connected to an integrated exhaust system of a factory or the like. In the filter unit 51, alkaline components, such as ammonia, contained in air are filtered by means of gas-liquid contact, so that the air excluding the alkaline components is supplied to the wall duct 46 through a pipe 52.

A high performance filter 53 is attached under the ceiling chamber 47. The cleaned air supplied from the filter unit 51 is passed through the wall duct 46 and then blows as downflow through the high performance filter 53 into the system.

In the developer unit (DEV) 61 of the first processing unit group G1 in the coating/developing system 1, a sub-chamber 63 is provided in an upper portion of a casing 62 forming outer walls of the developer unit 61. The sub-chamber 63 communicates with the wall duct 46 of the system. Therefore, the cleaned air flowing through the wall duct 46 blows as downflow into the developer unit (DEV) 61 through a high performance filter 64 attached under the sub-chamber 63. The atmosphere in the developer unit (DEV) 61 is exhausted through an exhaust pipe 65 to a space P under the ventilating opening plate 44.

Similarly, a sub-chamber 73 is provided in an upper portion of a casing 72 of the resist coating unit (COT) 71. The sub-chamber 73 communicates with the wall duct 46 of the system. Therefore, the cleaned air flowing through the wall duct 46 blows as downflow into the resist coating unit (COT) 61 through a high performance filter 74 attached under the sub-chamber 73. The atmosphere in the resist coating unit (COT) 71 is exhausted through the exhaust pipe 65 to the space P under the ventilating opening plate 44.

A rectifier member 13b for rectifying the airflow from the exposure machine S in a specific direction is provided in an upper portion of an opening 13a of the tunnel section 13 on the side of the coating/developing system 1. The rectifier member 13b is curved downward as shown in FIG. 4. It may have any other shape which can smoothly rectify the airflow from the exposure machine S in a specific direction. Further, the rectifier member 13b may have a structure in which the curvature thereof is adjustable so that the direction of airflow can be changed suitably. The opening 13a has an opening area through which the wafer transfer mechanism 24 can pass.

Figure 5:
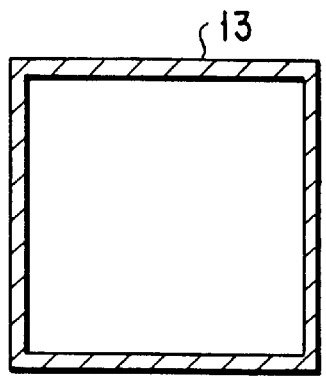
FIG. 5 is a cross-sectional view along an X-axis schematically showing a tunnel used to connect the coating/developing system and the exposure machine shown in FIG. 1.

As shown in FIG. 5, the cross section of the tunnel section 13 is rectangular in this embodiment. However, it can be, for example, circular. It is preferable that the panels constituting the tunnel section 13 be made of, for example, stainless steel, aluminum or plastics, i.e., material which does not produce particles or alkaline components.

The coating/developing system 1, the exposure device S and the tunnel section 13 connecting the system 1 and the machine S have the structures as described above.

An operation of the system will now be described. First, in the cassette station 10, the wafer transfer mechanism 21 accesses the cassette C which stores unprocessed wafers and which is mounted on the cassette table 20. It takes a wafer W out of the cassette C. The wafer transfer mechanism 21 is then moved to the alignment unit (ALIM) in the third processing unit group G3 of the process station 11, and places the wafer W in the alignment unit (ALIM).

When orientation flat alignment and centering of the wafer W are completed in the alignment unit (ALIM), the main wafer transferring unit 22 receives the aligned wafer W. The unit 22 moves to the front of the adhesion unit (AD) located under the alignment unit (ALIM), and transfers the wafer W to the adhesion unit (AD). Then, the wafer W is subjected to a resist coating process in the processing units successively.

After the resist coating process, the wafer W is transferred to the exposure machine S through the tunnel section 13 by the wafer transfer mechanism 24 of the interface section 12 of the coating/developing system 1. The wafer W is exposed with a predetermined pattern in the exposure machine S. The exposed wafer W is returned to the interface section 12 of the coating/developing system 1 through the tunnel section 13. The wafer W is then transferred by the transfer mechanism 24 to the extension unit (EXT) of the multi-stage unit of the fourth processing unit group G4 of the process station 11, and placed on a wafer reception table. Thereafter, the wafer W is transferred from the extension unit (EXT) to the developer unit (DEV) 61 and subjected to predetermined processes.

When the predetermined processes for the wafer are completed, the wafer W is transferred to a processed wafer storing cassette C on the table 20 by the wafer transfer mechanism 21 and stored therein.

As clear from the above descriptions, the wafer W is transferred between the coating/developing system 1 and the exposure machine S adjacent thereto through the tunnel section 13. Therefore, the wafer W is not exposed to an atmosphere outside the coating/developing system 1 and the exposure machine S. This is favorable to the subsequent processes for the wafer W.

As described before, the exposure machine S requires high accuracy in alignment and cleanliness of the atmosphere. Since the exposure machine S is connected by the tunnel section 13 to the coating/developing system 1 including the developer unit (DEV) 61, the resist coating unit (COT) 71, the baking units, etc., the heat or impurity, such as steam of organic solvent generated from the processing units, may flow into the exposure machine S through the tunnel section 13.

To prevent the above problem, the coating/developing system 1 is constructed so that the pressure in the casing 42, i.e., the pressure in the system 1, is smaller than the pressure in the exposure machine S. More specifically, the system 1 and the exposure machine S are respectively provided with pressure sensors 101 and 102. Output signals from the pressure sensors are input to the controller 103. The controller 103 monitors the internal pressures of the system 1 and the exposure machine S based on the output signals from the pressure sensors 101 and 102, and controls a pump 104 so that the internal pressure of the system 1 is lower than the internal pressure of the exposure machine S. In other words, the pump 104 controls the internal pressure of the system 1 through the exhaust pipe 49. Therefore, as shown in FIG. 4, the airflow indicated by the arrows is formed in the interior of the tunnel section 13. As a result, the atmosphere is prevented from flowing from the coating/developing system 1 to the exposure machine S, thereby keeping the atmosphere inside the exposure machine S clean and at a predetermined temperature. Consequently, the wafer W can be exposed suitably in the exposure machine S. In addition, since the airflow from the exposure machine S is rectified downward by the rectifier member 13b in the tunnel section 13, the downflow from the high performance filter 53 is not disturbed. Therefore, the atmosphere inside the coating/developing system 1 is kept clean.

Figure 6:
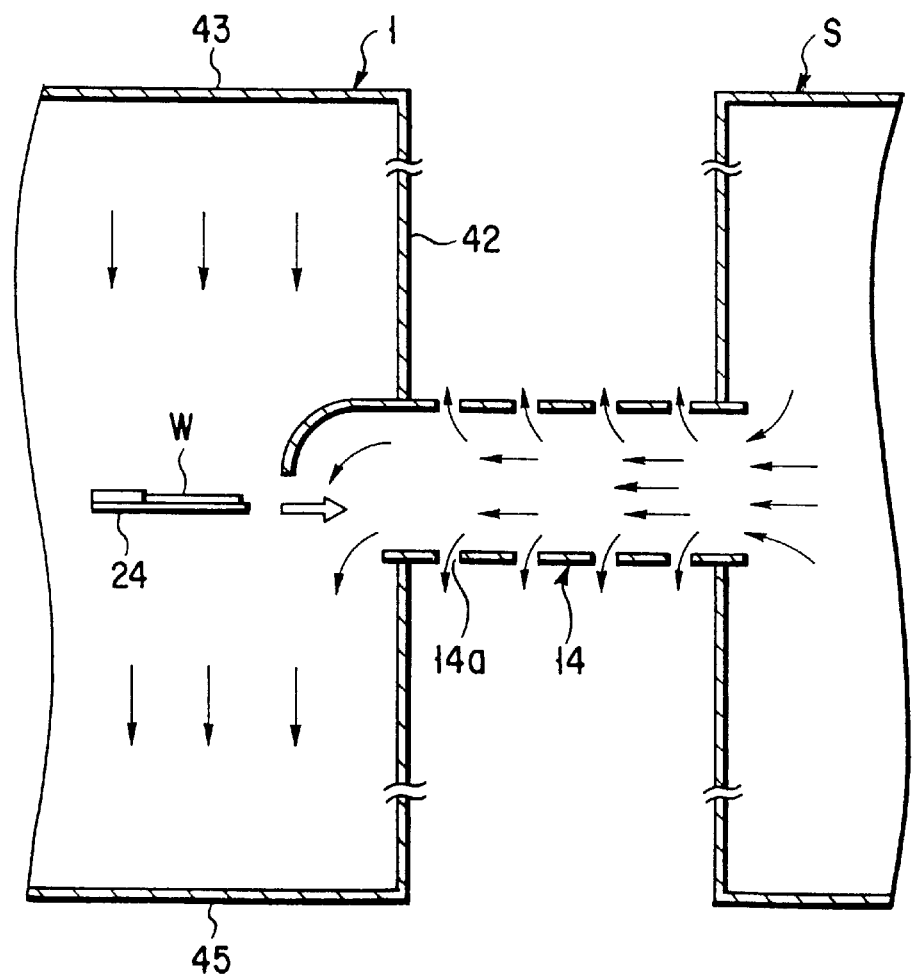
FIG. 6 is a cross-sectional view along the Y-axis schematically showing another tunnel.

In place of the tunnel section 13 of the above embodiment, a tunnel section 14 having ventilating openings 14a as shown in FIG. 6 may be used. With the tunnel section 14, even when the wafer transfer mechanism 24 enters the tunnel section 14 and the pressure in the tunnel section 14 is increased, the rise in pressure can be suppressed by the ventilating openings 14a. Therefore, air is prevented from flowing to the exposure device S from the coating/developing system 1.

The ventilating openings 14a allow part of the airflow in the tunnel section 14 from the exposure machine S to the coating/developing system 1 to gradually leak out from the tunnel section 14. Therefore, the flow rate of air which is finally blown to the coating/developing system 1 can be adjusted. By virtue of the adjustment of the flow rate of the air, the downflow formed in the interface section 12 of the coating/developing system 1 is not influenced and the atmosphere is kept clean.

Figure 7:
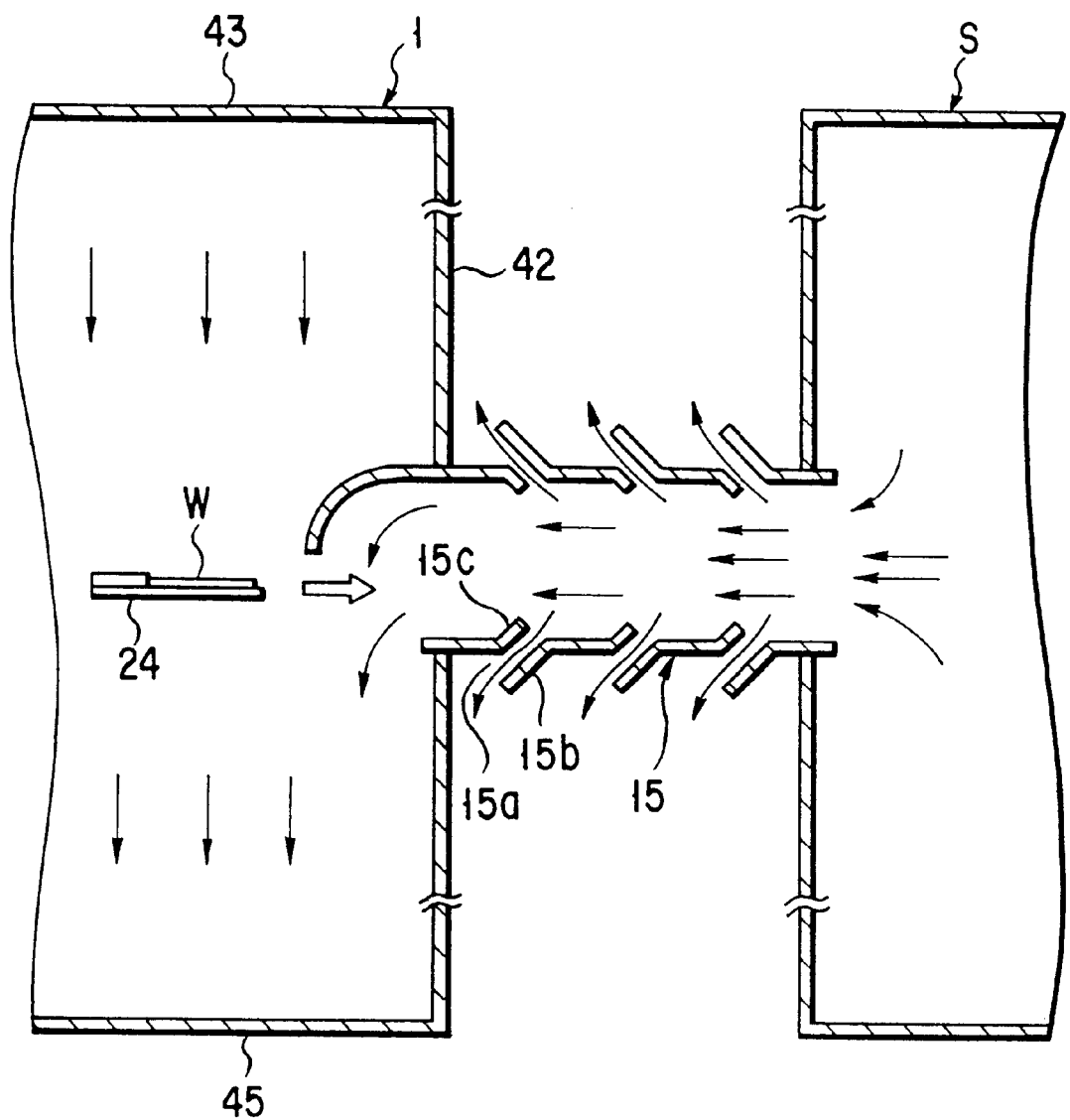
FIG. 7 is a cross-sectional view along the Y-axis schematically showing still another tunnel.

It is possible to use a tunnel section 15 in which other rectifier members are added to the ventilating openings 14a of the tunnel section 14. As shown in FIG. 7, ventilating openings 15a of the tunnel section 15 have rectifying fins 15b and 15c directed to the coating/developing system 1. The rectifying fins 15b and 15c allow the airflow within the tunnel 15 to smoothly flow out of the tunnel section 15. Moreover, since the rectifier fins 15b and 15c cover the ventilating openings 15a, even in case of system down of the coating/developing system 1 or the exposure machine S, impurities such as particles flowing in the clean room are not enter the tunnel section 15.

In the above embodiment, the processing system of the present invention is applied to a coating/developing system for subjecting a wafer W to a resist solution coating process or developing process, connected to another device for exposing the wafer W with a predetermined pattern. However, the present invention is not limited to the embodiment, but can be applied to a diffusion processing machine having a vertical furnace and an entrance section connected thereto. The substrate is not limited to a wafer, but may be an LCD substrate, a CD substrate, a photo mask, a print circuit board or a ceramic board.

According to the present invention, airflow to the processing system from the other device is produced by regulating the pressures of the two sections. Therefore, in a case where the processing system is a coating/developing system like the above embodiment, even if steam of an organic solvent, a high-temperature atmosphere or particles are generated in the coating/developing system, they do not flow into the other device. Thus, the substrate can be subjected to a predetermined process in the other device in a clean atmosphere at a predetermined temperature.

The casing of the processing system may be connected to the other device through a tunnel section. In this case, since a substrate is transferred between the processing system and the other device through the tunnel section, the substrate is not exposed to an external atmosphere during the transfer. Moreover, since the atmospheres in the processing system and the other device are brought into contact only in the tunnel section, the atmospheres in the two sections can be easily adjusted relative to each other. A rectifying member for rectifying airflow may be provided in an opening portion on the processing system side of the tunnel section to rectify the airflow from the tunnel section in a specified direction. In this case, downflow formed in the processing system is not disturbed, and impurities such as particles generated within the processing system are guided in a specified direction within the system, so that the atmosphere in the processing device can be kept clean. In a case where a ventilating portion is formed in the panel members constituting the tunnel section, even if the pressure in the tunnel section is changed when the substrate passes therethrough, the pressure change can be coped with. For example, a rise in pressure in the tunnel section can be moderated.

The present invention has the following advantages. An atmosphere is prevented from flowing from the processing system to another device connected thereto, so that a substrate can be subjected to a predetermined process in a clean atmosphere at a predetermined temperature in the other device. The atmospheres in the processing system and the other device can be easily adjusted relative to each other. Further, since the downflow in the processing system is not disturbed by the airflow from the other device, the atmosphere within the processing system can be maintained suitably. Further, even if the pressure in the tunnel section is changed when the substrate passes therethrough, the atmosphere in the processing system can be prevented from flowing into the other device. Furthermore, since a rise in pressure in the tunnel section can be moderated, the downflow in the processing system is not disturbed. Thus, the atmosphere within the processing system can be maintained suitably.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A processing system comprising:
   a coating/developing machine configured to perform at least one of a solution processing for processing a substrate with solution and a thermal processing for thermally processing the substrate;
   a transfer unit configured to transfer the substrate into and from the coating/developing machine;
   a casing configured to encase the coating/developing machine and the transfer unit; an interface section provided in the casing and configured to transfer the substrate into and from an external machine configured to perform a processing different from the solution processing and the thermal processing;
   a pressure setting unit configured to set a pressure in the casing lower than a pressure in the external machine to avoid a flow of atmosphere from the coating/developing machine to the external machine; and
   a tunnel section configured to connect the casing and the external machine, the tunnel section being constituted by a panel member having a rectifier member, provided on a side of the casing, for rectifying gas flowing from the external machine through the tunnel section to the casing in a specified direction.

2. The processing system according to claim 1, wherein the tunnel section has a rectangular cross section.

3. The processing system according to claim 1, wherein the tunnel section has a circular cross section.

4. The processing system according to claim 1, wherein the rectifier member is constituted by a curved portion curved in the specified direction and formed integral with an end portion of the panel member.

5. The processing system according to claim 1, wherein the tunnel section is constituted by a panel member made of stainless steel.

6. The processing system according to claim 1, wherein the tunnel section is constituted by a panel member made of aluminum.

7. The processing system according to claim 1, wherein the tunnel section is constituted by a panel member made of synthetic resin.

8. The processing system according to claim 1, wherein the pressure setting unit comprises a pressure adjusting device which monitors the pressures in the casing and the external machine and controls the pressure in the casing.

9. The processing system according to claim 1, wherein the pressure setting unit comprises pressure sensors which respectively monitor the pressures in the casing and the external machine and output detection signals, and a pressure adjusting device which controls the pressure in the casing based on the detection signals output from the pressure sensors.

10. The processing system according to claim 1, wherein said external machine includes an exposure machine which performs an exposure processing to the substrate.

11. The processing system according to claim 1, wherein the specified direction is downward.

12. A processing system comprising:
    a coating/developing machine configured to perform at least one of a solution processing for processing a substrate with solution and a thermal processing for thermally processing the substrate;

a transfer unit configured to transfer the substrate into and from the coating/developing machine;

a casing configured to encase the coating/developing machine and the transfer unit;

an interface section provided in the casing and configured to transfer the substrate into and from an external machine configured to perform a processing different from the solution processing and the thermal processing;

a pressure setting unit configured to set a pressure in the casing lower than a pressure in the external machine to avoid a flow of atmosphere from the coating/developing machine to the external machine; and a tunnel section configured to connect the casing and the external machine, the tunnel section being constituted by a panel member having a rectifier member, provided on a side of the casing, for rectifying gas flowing from the external machine through the tunnel section to the casing downward.

13. The processing system according to claim 12, wherein the rectifier member comprises a curved portion curved downward and formed integral with an end portion of the panel member.

14. A processing system comprising:

a coating/developing machine configured to perform at least one of a solution processing for processing a substrate with solution and a thermal processing for thermally processing the substrate;

a transfer unit configured to transfer the substrate into and from the coating/developing machine;

a casing configured to encase the coating/developing machine and the transfer unit;

an interface section provided in the casing and configured to transfer the substrate into and from an external machine configured to perform a processing different from the solution processing and the thermal processing;

a pressure setting unit configured to set a pressure in the casing lower than a pressure in the external machine to avoid a flow of atmosphere from the coating/developing machine to the external machine; and a tunnel section configured to connect the casing and the external machine, the tunnel section being constituted by a panel member having a ventilating portion communicating with an external atmosphere.

15. The processing system according to claim 14, wherein the ventilating portion has a plurality of ventilating holes formed in the panel member.

16. The processing system according to claim 14, wherein the ventilating portion comprises a ventilating member having a rectifying fin formed integral with the panel member.

17. The processing system according to claim 14, wherein the ventilating portion comprises a plurality of ventilating holes formed in the panel member and a rectifying fin formed integral with the panel member and covering the ventilating holes.

* * * * *